US009035199B2

(12) United States Patent
Janota et al.

(10) Patent No.: US 9,035,199 B2
(45) Date of Patent: May 19, 2015

(54) EMI SHIELDING MEMBER, PARTICULARLY SUITABLE FOR SHIELDING OF MODULE CAGES

(75) Inventors: Kenneth F. Janota, Conway, AR (US);
Eran J. Jones, Conway, AR (US);
Marlon C. Daniels, Oak Park, IL (US);
Michael Alan Johnston, Maumelle, AR (US)

(73) Assignee: Molex Incorporated, Lisle, IL (US)

( * ) Notice: Subject to any disclaimer, the term of this patent is extended or adjusted under 35 U.S.C. 154(b) by 247 days.

(21) Appl. No.: 13/698,788

(22) PCT Filed: May 19, 2011

(86) PCT No.: PCT/US2011/037126
§ 371 (c)(1),
(2), (4) Date: Apr. 4, 2013

(87) PCT Pub. No.: WO2011/146701
PCT Pub. Date: Nov. 24, 2011

(65) Prior Publication Data
US 2013/0199835 A1    Aug. 8, 2013

Related U.S. Application Data

(60) Provisional application No. 61/346,281, filed on May 19, 2010.

(51) Int. Cl.
*H05K 9/00* (2006.01)
(52) U.S. Cl.
CPC ............. *H05K 9/002* (2013.01); *H05K 9/0007* (2013.01); *H05K 9/0083* (2013.01); *H05K 9/0084* (2013.01); *H05K 9/0088* (2013.01)

(58) Field of Classification Search
CPC .................................................... H05K 9/0015
USPC ................... 174/355, 390, 369, 385, 386; 439/607.2, 607.21
See application file for complete search history.

(56) References Cited

U.S. PATENT DOCUMENTS

| 4,977,296 A   | * | 12/1990 | Hemming ....................... 174/363 |
| 6,752,663 B2  |   | 6/2004  | Bright et al. |
| 6,901,660 B2  | * | 6/2005  | Miska ............................. 29/846 |
| 7,869,224 B1  | * | 1/2011  | Yang ............................. 361/800 |
| 8,449,331 B2  | * | 5/2013  | Phillips et al. ........... 439/607.21 |
| 8,613,632 B1  | * | 12/2013 | Nichols ..................... 439/607.21 |

(Continued)

FOREIGN PATENT DOCUMENTS

WO     WO 2004/088381 A1     10/2004

OTHER PUBLICATIONS

International Search Report for PCT/US2011/037126.

*Primary Examiner* — Hung V Ngo (57) ABSTRACT

A receptacle assembly includes a hollow conductive cage with a front end and an opening to an interior portion of the cage. The opening is configured to receive a module assembly therein. The cage has a bottom with a bottom opening communicating with the interior portion, and the bottom is configured to be joined to a circuit board. A layered EMI shield member is provided between the bottom of the cage and the circuit board and the shield member extends completely around the bottom opening of the cage. The EMI shield member is formed as a flexible, low-cost assembly that utilizes a pair or insulative layers that flank a conductive layer.

20 Claims, 9 Drawing Sheets

(56) References Cited

U.S. PATENT DOCUMENTS

| | | |
|---|---|---|
| 2008/0047746 A1 | 2/2008 | Chen et al. |
| 2009/0114437 A1* | 5/2009 | Tuen et al. .................... 174/350 |
| 2011/0226521 A1* | 9/2011 | Wertz et al. .................... 174/366 |
| 2012/0048612 A1* | 3/2012 | Bunyan et al. ................ 174/358 |

* cited by examiner

EMI SHIELDING MEMBER, PARTICULARLY SUITABLE FOR SHIELDING OF MODULE CAGES

BACKGROUND OF THE PRESENT DISCLOSURE

The Present Disclosure relates generally to structures used in and associated with electronic modules for reducing electromagnetic interference (EMI) radiation therefrom, and more particularly to a cost-effective shielding member for use with a shielding cage which houses a connector on a printed circuit board and receives an electronic module therein, for mating to the connector.

Electronic modules are used to connect various electronic devices together. Such modules are usually terminated to opposing ends of a cable to define a cable assembly that is used to interconnect a server to a router, for example. Such modules may incorporate fiber optic, electrical or combined transceivers that are formed in the shape of a plug. Such plugs are received within receptacles that are disposed within electrical equipment. These receptacles can include metal or die cast guide frames or sheet metal or metalized cages to form a conductive receptacle. Such a receptacle commonly includes opposing top and bottom walls, opposing side walls joining the top and bottom walls together to define a four walled enclosure. A rear wall typically interconnects the side walls and top walls together with an opening formed in the bottom wall so that the receptacle can be mounted to a circuit board over a connector, which is also mounted to the circuit board.

These modules are often constructed in accordance with various standards that dictate the size and compatibility so that modules can be used interchangeably within a standard. These standards are now envisioning data transfer rates of 25 gigabytes per second (GBPS) and upwards of 100 GBPS or greater.

At such high data transfer speeds, the modules generate electromagnetic energy. As the amount of such energy increases, the energy may pass through gaps in the receptacle to an extent that it causes EMI that can adversely affect the transmission of data signals through the module, and the adjacent modules associated electronic equipment to which it is connected. It is therefore desirable to shield data signals from EMI to the entire extent of the receptacle.

In most cage-style receptacles having a lower opening, gaskets are provided along a portion of the perimeter opening. For example, U.S. Pat. No. 6,752,663 discloses the use of a conductive foam gasket that extends along three sides of the receptacle bottom opening. A separate metal spring is positioned along the fourth side of the opening. Extending the foam gasket to cover the fourth side of the spring is impractical and it may lead to poor mounting of the receptacle on the circuit board. Thus the need for the metal spring gasket along the fourth side. This type of multiple-piece assembly is costly costing approximately more than a dollar to manufacture. There is additional cost associated with applying the gasket to the receptacle. It is therefore desirable to provide an inexpensive member to a receptacle for purposes of providing EMI shielding to the receptacle.

BRIEF DESCRIPTION OF THE PRESENT DISCLOSURE

In accordance with an exemplary embodiment of the Present Disclosure, an improved EMI shielding member is provided for use with a receptacle assembly. The receptacle assembly takes the form of a rectangular, hollow enclosure defined by four walls, three of which have common lengths and the remaining wall, the bottom wall has a length less than the common length. In this manner, an opening is defined in the bottom wall of the receptacle, the receptacle may have members by which it is attached to a circuit board, such as compliant pins and within the attachment structure, the receptacle is usually spaced above the circuit board for a height of approximately 0.012 to 0.015 inches. This gap permits EMI to occur around the perimeter of the receptacle bottom wall opening.

A shield member in the form of a multi-layered sheet or generally planar member is provided and preferably attached to the bottom wall of the receptacle. The shield member extends completely around the perimeter of the opening. Preferably, the shield member has a thickness of about 0.004 to about 0.015 inches, or slightly greater, and is stable enough that it can be formed and configured as desired. Some desirable configurations include dimples, a waffle pattern, a dimpled pattern and/or an accordion pattern. These and other similar patterns will provide vertical extents of the shield member that are interposed in the gap and which extend into contact with the shield bottom wall and the circuit board mounting surface. Suitable patterns may have a general peak and valley arrangement with the peaks providing contact points opposing the receptacle bottom wall and the valleys providing contact points opposing the circuit board and still other patterns may take the form of wrinkles disposed in the shield member having random projections that project upward or downwardly from respective top and bottom surfaces of the shield member.

Although a conductive element such as a metal plate or a formed gasket is known in the art to provide adequate EMI protection, it requires more complex labor to form a metal plate or gasket, and both the plate and the gasket are expensive. Therefore, in accordance with the present disclosure, we utilize an EMI shield member that is formed from multiple components, one such component being a conductive material and the other such component being at least a dielectric material.

Accordingly, the shield member is a multiple component, or element sheet. Preferably, this shield member includes a conductive layer utilizing aluminum, copper or similar metals and alloys thereof, taking the form of a sputtered discharge, vacuum deposition or even a foil, which is sandwiched, or otherwise held between two insulative or dielectric layers. In an exemplary embodiment, the layers include a polyester layer and a polyethylene layer, the latter preferably being static dissipative in nature. The former may also include an exterior coating, such as an antistatic coating. One material that has been used by us and which has produced suitable results is one used to manufacture electrostatic discharge bags, such as that marketed by 3M Corporation, under the name SCC 1000-Static Shielding Bag-Metal In. This material has an interior and exterior surface resistivity of less than about $10^{12}$ ohm-cm and a metal resistivity of 100 ohms.

Other ESD bag materials may give similar results including pink polyethylene, block conductive polyethylene and nylon ESD bag material especially in applications where reflow soldering is not utilized. It has been found by us that ESD bag material may melt when the circuit boards on which it is used are subjected to the high temperatures encountered in IR reflow soldering. In these instances, we have discovered that the use of a Kapton film or a Cho-Mute film (such as Chomerics CHO-MUTE 9020 RF Absorber material) as the dielectric material provides good results and the Kapton film stands up to the high temperatures of the reflow ovens. The layered material, as noted above, may preferably have a thickness sufficiently thick to permit it to be formed with a plurality of contact points, in the form of a waffle pattern, a dimple pattern, an accordion pattern or a random pattern of what may best be described as wrinkles. Minimum thickness sheets may be used without any specific pattern as they tend to form their own pattern of contact points via wrinkles that will occur during attachment of the shield member to its associated receptacle.

The shield member may be applied directly to the bottom wall of the receptacle in a manner such that the compliant pins of the receptacle that are used to mount it to a circuit board pierce the layered material, or are larger in width than the diameter of any associated holes through which the compliant pins pass. Additionally, two or more side flaps may be formed and bent upwardly. The inner faces of these flaps may be coated with a pressure sensitive adhesive used to adhere the shield member to the receptacle.

BRIEF DESCRIPTION OF THE DRAWINGS

During the course of the following detailed description of the Present Disclosure, reference will be made to the following drawings in which like members identify like ports and in which.

DETAILED DESCRIPTION OF THE PREFERRED EMBODIMENTS

Figure 1:
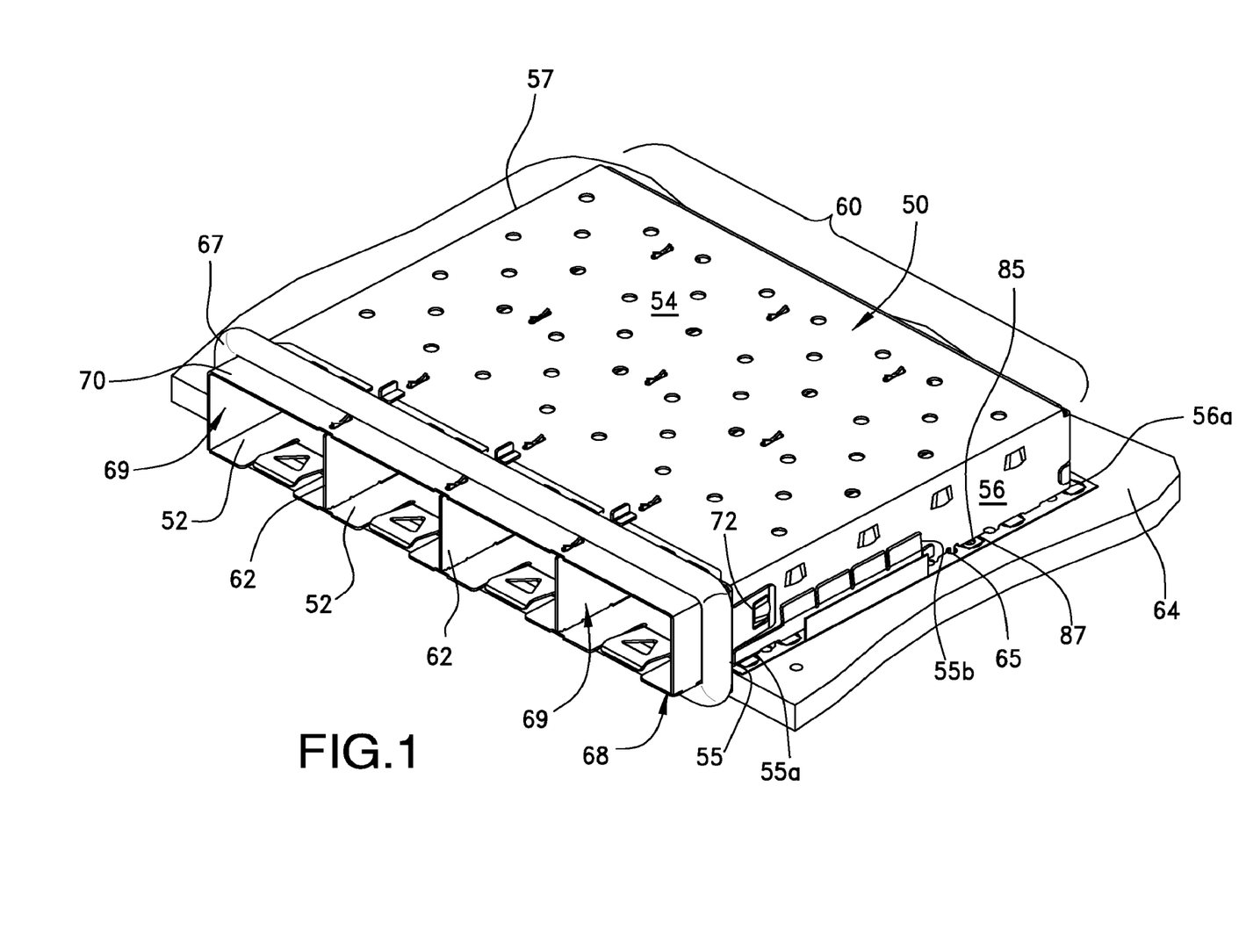
FIG. 1 is a perspective view of a multiple-by receptacle assembly configured to receive a series of electronic modules therein.

The drawings illustrate various structural aspects of the Present Disclosure. FIG. 1 illustrates a receptacle 50 for use in electronic equipment and the receptacle shown is a "ganged" receptacle, meaning that is has a plurality of hollow bays 52 arranged in a horizontal row, each of which is configured to receive a single electronic module, either copper of fiber optic (not shown) therein. As such, the receptacle 50 includes opposing top and bottom walls 54, 55 and side walls 56, 57 that are combined together by way of slots and tabs as is known in the art to form a 1×4 receptacle assembly 60 that has four module-receiving hollow bays 52. Interior walls 62 are utilized to divide the space between the two side walls 56, 57 into additional hollow bays 52. In the embodiment illustrated, the side walls 56, 57 may be formed integrally with the top wall 54 and possess an inverted U-shaped configuration, the bottom of which is covered by a separate bottom wall 55. Alternatively, the top, side and bottom walls may be integrally formed together as one piece and folded in a manner so that a free edge 55a of the bottom wall 55 is joined together with the free edge 56a of side wall 56. Although this description utilizes a ganged receptacle as an illustration, it will be understood that the receptacle may take other configurations such as a single bay receptacle or a stacked receptacle.

The receptacle 50 is shown mounted to a circuit board 64 and this mounting typically occurs by way of a plurality of mounting pins, illustrated as compliant pins 65 that are formed as part of the receptacle 50, either as part of the side walls 56, 57 and interior walls 62 or formed from the bottom wall 55. These compliant pins 65 are received within corresponding mounting holes, or vias, 66 that are formed in the circuit board 64. A compressible gasket 67 in the form of a continuous ring member may be applied to the exterior of the receptacle 50 near the front end 68 thereof and positioned thereon and further spaced rearwardly of the front openings 69 so as to make contact with the rear surface of a bezel, or faceplate (not shown). The front end 68 of the receptacle 50 may be formed integrally with the receptacle, or it may be formed as a separate hollow collar portion 70 that serves as an extension along the front end 68. This collar portion 70 may have locking tabs 72 formed therewith which are configured to selectively engage a module inserted into one of the bays 52.

The circuit board 64 may include a designated area 72 that is configured to receive a board connector 74 mounted thereto (shown in phantom) that has a card-receiving slot 75 configured to receive a mating blade, or circuit card of a corresponding module, copper or fiber-optic. In this regard, the board 64 has a plurality of contact pads 76 arranged in a pattern so as to engage the tails of terminals of the board connector 74. The bottom wall 55 of the receptacle includes one or more openings (not shown) that fit over the board connector(s). In the embodiment illustrated, the opening is defined between the rear wall 58 of the receptacle 50 and the trailing edge 55b of the bottom wall 55. The rear wall 58 may be an extension of the top wall 54 that is folded along an endline 54a, or it may be formed from either of the sidewalls 56, 57 or it may be a separate member.

The compliant pins 65 which are used to mount the receptacle 50 to the circuit board 64 are received in vias 66, as is know in the art in a manner such that the board connectors 74 are received within corresponding openings and bays of the receptacle. It is very difficult to force the receptacle to fit exactly flush on and in an intimate and continuous contact with the top surface of the circuit board 64. It is common for a gap to be present between the board 64 and the receptacle 50. This gap can range from between about 0.010 inches and about 0.020 inches. This gap communicates with the bottom opening(s) of the receptacle 50 and defines an area where EMI may occur. Previous attempts to stop the EMI from occurring at this gap have included, as noted above in U.S. Pat. No. 6,752,633, a formed, conductive elastomeric gasket that extends around three of the four sides of the receptacle bottom wall opening and a metal spring gasket that is positioned proximate to the fourth edge of the opening. This approach is expensive as the forming of the metal spring gaskets and the elastomeric gaskets are costly, in the range of $1.50 or more per receptacle and further involves additional labor in registering the gaskets with the receptacle opening in order to obtain the proper positioning. The elastomeric gasket is still further relatively thick in order to obtain effective EMI shielding and needs to be compressed between the receptacle and the board. This may lead to differences in the desired height of the receptacle on the board that may be mandated by a particular electronic standard. Still further, in accordance with the disclosure of the '663 patent, an elastomeric gasket cannot be used at the front edge of the receptacle opening because it would raise the receptacle to an unacceptable height and would extend into the receptacle interior hollow bay where it runs the risk of providing interference with the insertion of a module therein.

Figure 2:
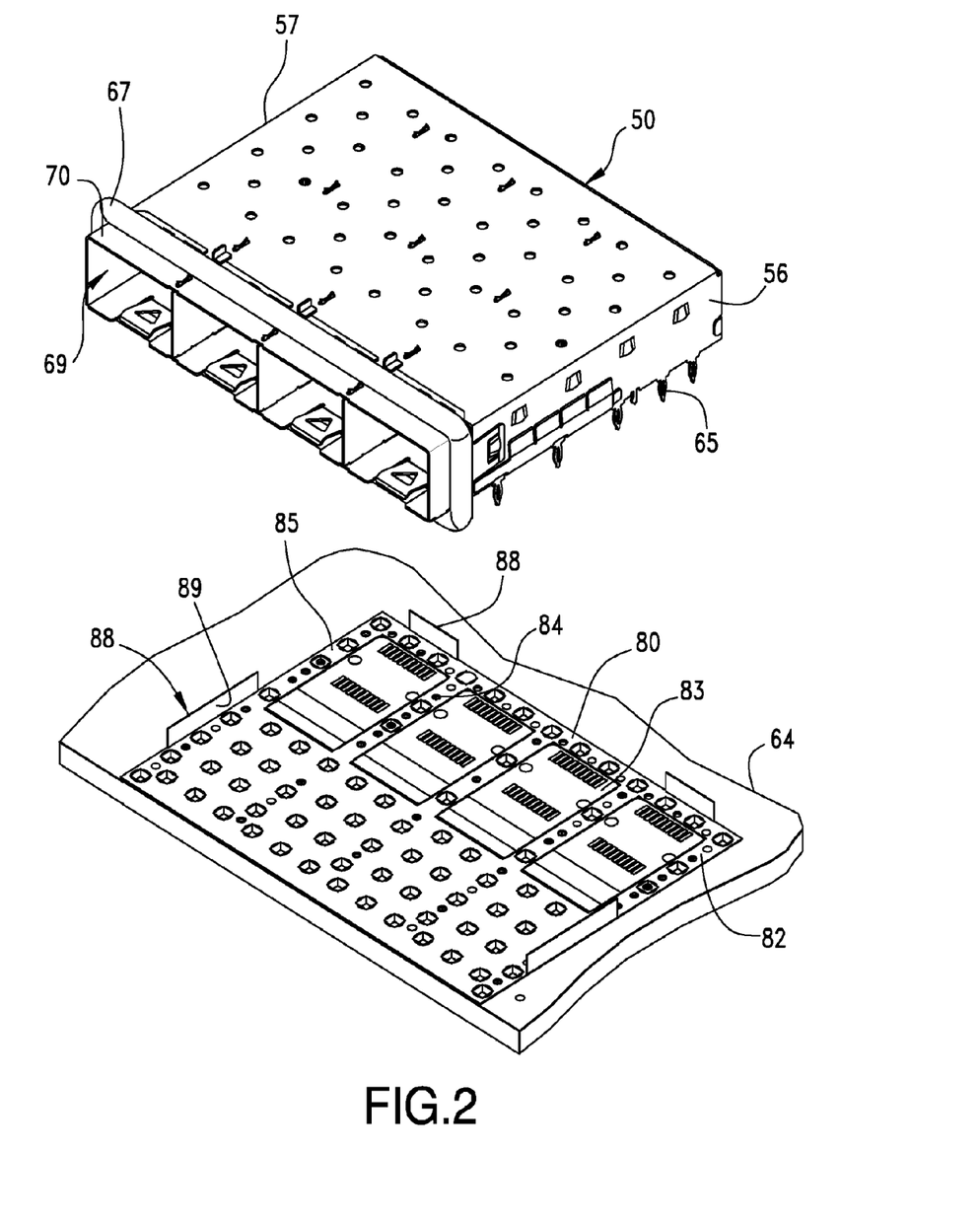
FIG. 2 is an exploded view of the assembly of FIG. 1.

We have found that effective EMI shield can be obtained by utilizing shield member in the form of a layered structure utilizing two or more distinct materials. As illustrated in FIG. 2, this shield member 80 generally takes the form of a sheet 82 which includes one or more openings 83 formed therein that correspond to the openings of the receptacle 50 to which the shield member is applied. The openings 83 are separated from each other in the widthwise direction of the shield member 80, by lengthwise extending rib portions 84 that typically have a width greater than the thickness of the interior (and side) walls 62, 56 & 57 of the receptacle 50. The shield member 80 in effect, defines an intervening layer 85 or interposer, that is disposed between the receptacle 50 and the circuit board 64 and which extends completely around the entire perimeter of the opening in contrast to the structure disclosed in the '663 patent. Such a shield structure may be manufactured at a far less cost than the formed gaskets shown therein.

Figure 3:
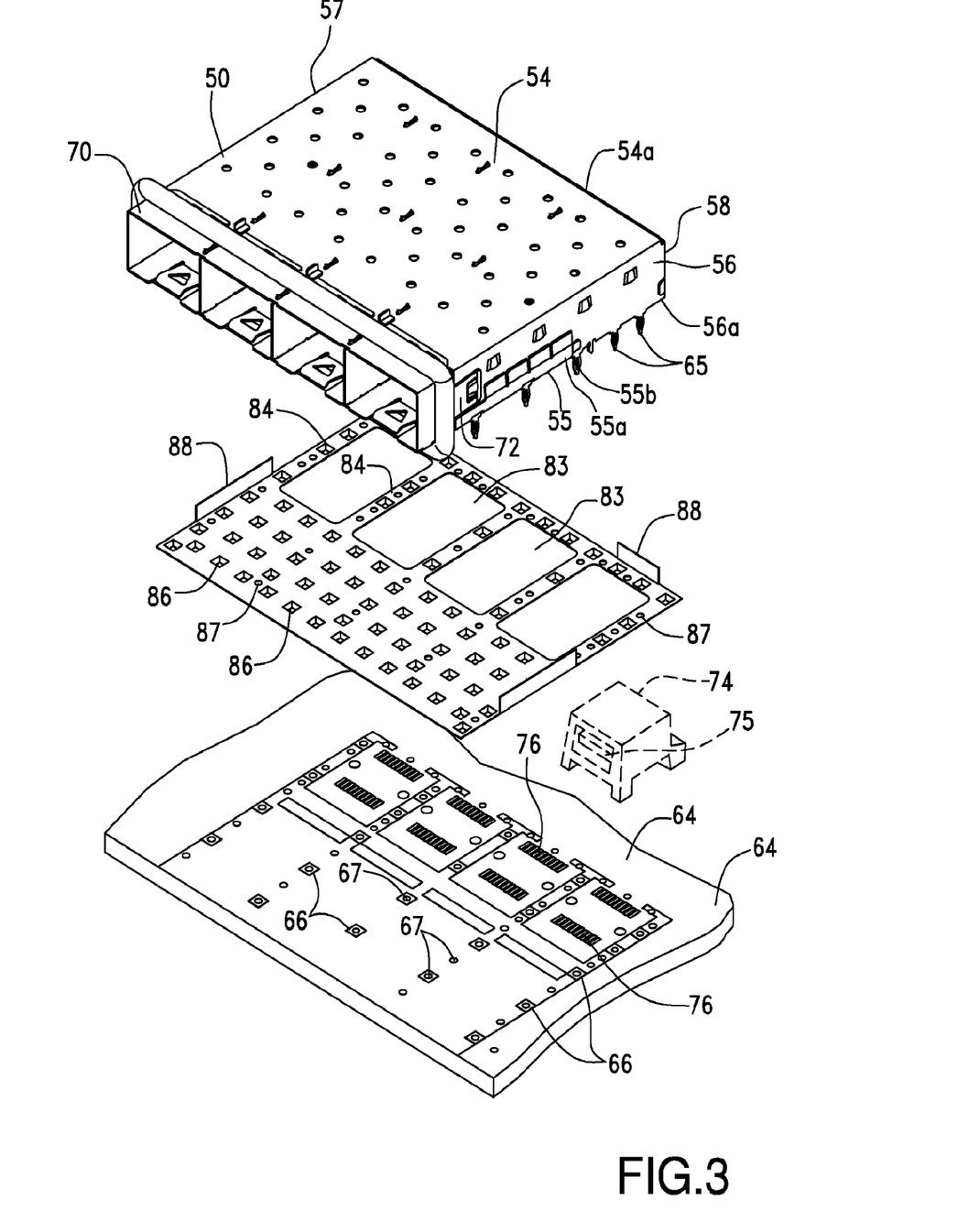
FIG. 3 is the same view as FIG. 2 but with the intervening shield member shown removed from the circuit board.
Figure 3A:
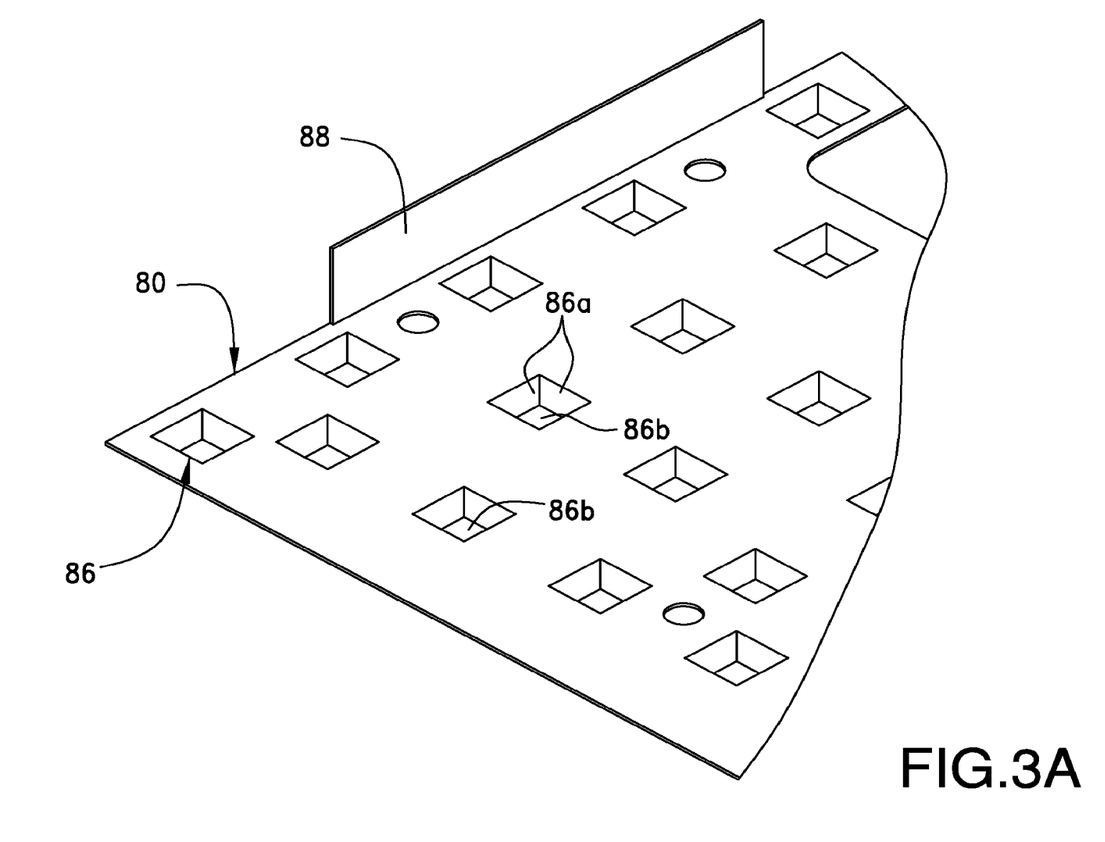
FIG. 3A is an enlarged detail view showing the waffle pattern impressed upon the shield member of FIG. 3.

The shield member 80 is also preferably patterned in its board-contacting portions in a manner that is has a plurality of elements that extend out of the general horizontal plane of the shield member. These contact portions, in the various embodiments described to follow may extend out of the plane of the shield member in one direction from one surface thereof or they may extend out of the plane of the shield member in two directions from two opposing surfaces of the shield member. In FIGS. 3 & 3A, this pattern is shown as a waffled pattern with a series of impressions 86 that are formed therein and which extend downwardly toward the surface of the circuit board 64. These impressions 86 are spaced so that contact is made between the circuit board and the bottom surfaces of the receptacle 50. As shown each impression 86 has multiple sides, or sidewalls 86a (shown as four) that surround the floor and which are joined to the floor, or contact portion 86b. These impressions 86 serve to provide multiple points of contact to the circuit board 64 between the receptacle and the board. Ideally, the shield member is not compressible, but the impressions 86 may collapse to some extent upon themselves when the receptacle is mounted to the circuit board. As illustrated best in FIG. 3, the impressions 86 are disposed throughout the extent of the shield member 80, including the rib portions 84 and the rear portion that connects the rib portions 84 together.

Figure 4:
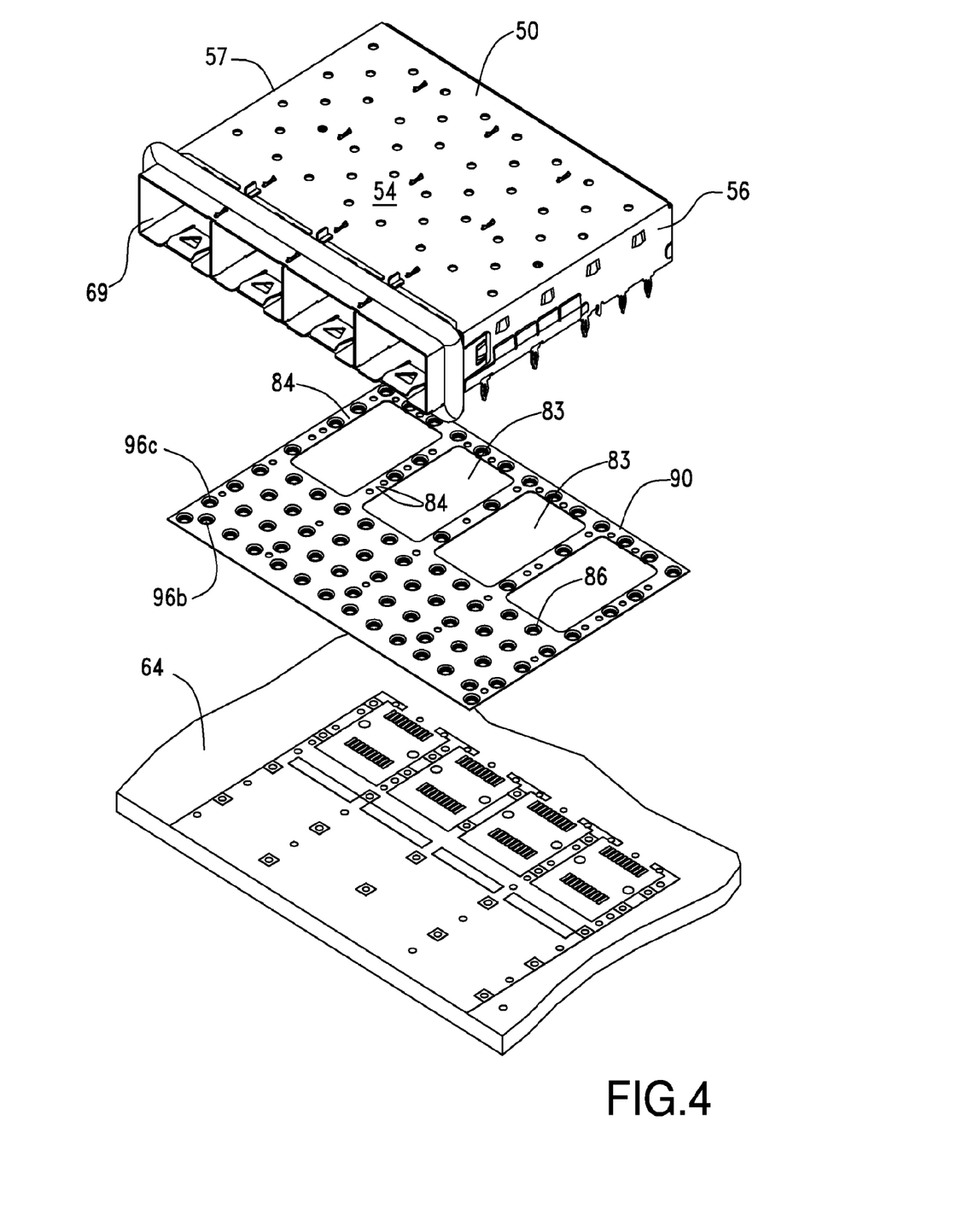
FIG. 4 is the same view as FIG. 3, but with an alternate dimple pattern impressed upon the shield member.
Figure 4A:
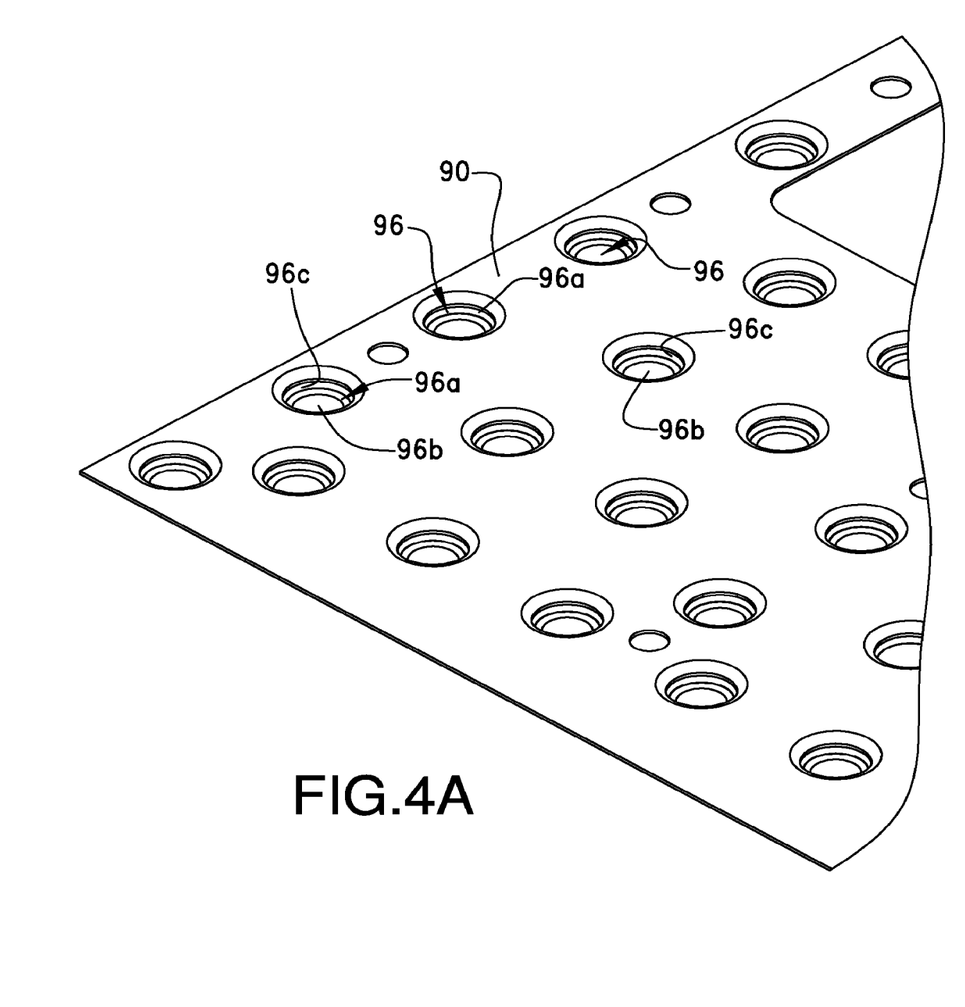
FIG. 4A is an enlarged detail view of the shield member of FIG. 4 showing the dimpled pattern more closely.
Figure 5:
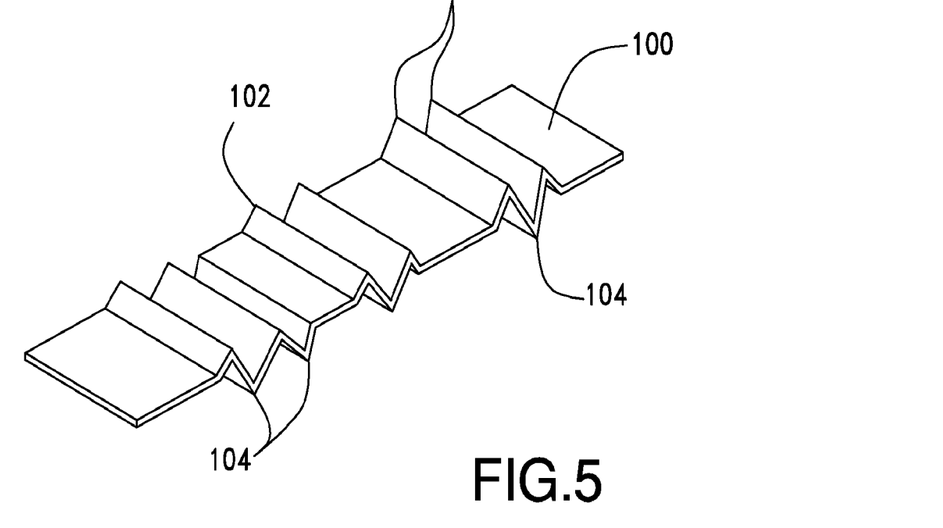
FIG. 5 is an alternate embodiment of a shield member in accordance with the disclosure, illustrating a random accordion-shaped series of contact points.
Figure 5A:
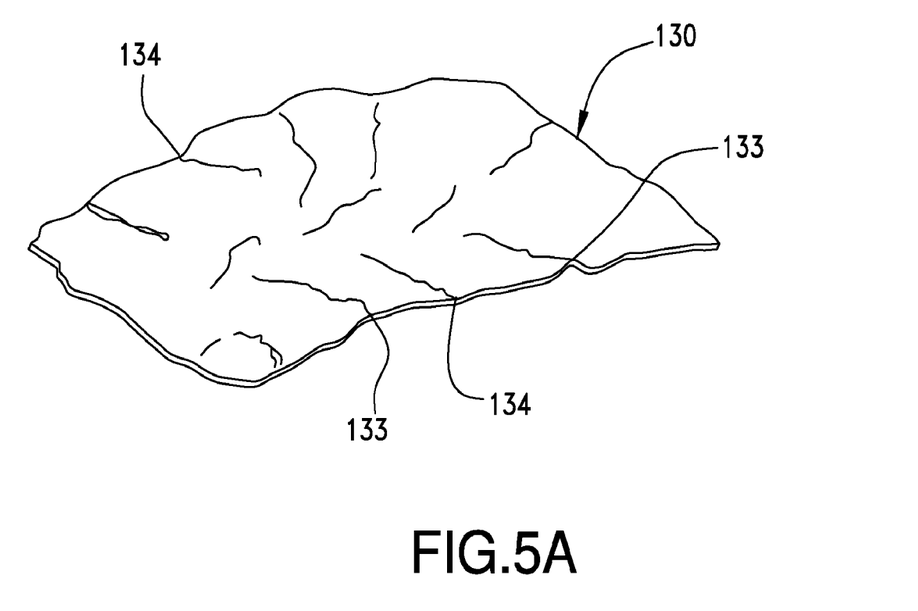
FIG. 5A is another alternate embodiment of a shield member that utilizes wrinkles in the body of the shield member to provides the contact points.

FIGS. 4 & 4A illustrate alternate embodiment of a shield member 90 that has a generally flat profile but in which the impressions 96 are formed as dimples 96a, or recesses, dispose in the shield member and each of which includes a floor, or contact portion 96b that is surrounded by a single connecting sidewall, or shoulder portion 96c. In this manner, the dimples 96a form contact points that may at least partially collapse upon themselves when the receptacle 50 is mounted to the circuit board. In yet still another embodiment, as illustrated in FIG. 5, the shield member 100 may have a somewhat random, accordion-shaped configuration with a plurality of intermittent peaks 102 and valleys 104 that provide the desired contact points projecting in two opposing directions from the overall horizontal plane the shield member occupies in place between the receptacle and the shield member. Still further, the shield member may be formed of a very small thickness such that it will wrinkle when applied to either the receptacle or circuit board. These wrinkles will form contact points similar to the peaks and valleys of FIG. 5. FIG. 5A illustrate such a wrinkled shield member 130 that has wrinkles 132 that manifest themselves as ridges 133 and depressions 134 which extend out of the general plane of the shield member in opposing directions and form opposing surfaces of the shield member.

The contact points may be formed in an ordered arrangement, or pattern, in the shield member or they may be randomly disposed within the body of the shield member. Such a random pattern is used most often in instance where the contact points are not directly formed in the shield member body, in the manner of the impressions 86 and recesses 96 described above. In this embodiment, as well in the others previously described, the accordion structure collapses upon itself when the receptacle 50 is placed onto the circuit board 64 to form the wrinkles and/or peaks and valleys. The shield member thickness may vary and the thickness will facilitate the formation of the contact points, it being understood that thinner shield members will form wrinkles and peaks and valleys, while thicker shield members 50 permit the formation of distinct impressions, recesses and the like therein.

Figure 3B:
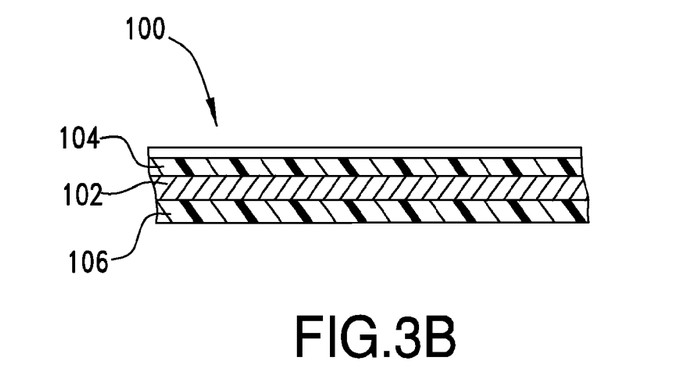
FIG. 3B is a sectional view illustrating the layered structure of the shield member.

One material from which the shield members of the Present Disclosure have been s made, is one which is used to provide static discharge protection, and is known in the art as either ESD (electrostatic discharge) material or ESD bag material. Such materials may include purely insulative materials such as polypropylene or materials that are metallized and which include a conductive metal layer that may be embedded or encapsulated within insulative layers. As such, the preferable material that has been found to produce effective EMI shield and which is cost-effective as compared to a formed EMI gasket structure is a multi-layered structure in which a metal layer, such as aluminum (or copper) foil or sputtered/deposited aluminum (or copper) is sandwiched between two flanking, dielectric and insulative layers, shown in FIG. 3B as a polyester layer 104 and a polyethylene layer 106, the latter preferably being static-dissipative in nature. Other metals or alloys may be used for the conductive material. The former may also include an exterior coating, such as an antistatic coating as shown in the sectional view of FIG. 3B which illustrates an exemplary embodiment of a shield member for use as an EMI shield member. One material that has produced suitable results is that which is manufactured by 3M Corporation, as a SCC 1000-Static Shielding Bag-Metal In ESD bag material. This material has an interior and exterior surface resistivity of less than $10^{12}$ ohm-cm and a metal resistivity of 100 ohms. The combination of the polyester dielectric and the metal layer provide Faraday Effect shielding for electrostatic discharge and so also interrupts the emanation of EMI from the module and connector around the perimeter of the receptacle opening. Likewise, as explained below, other materials such as Kapton and CHO-MUTE may be used to replace the polyester and polyethylene layers as noted above to form the shield member.

Figure 3C:
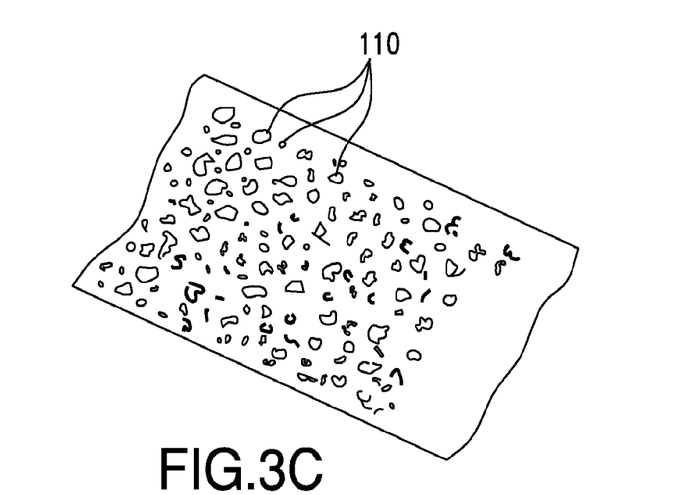
FIG. 3C is a perspective view of a shield member, illustrating conductive deposits applied to a substrate.

The term "layer" as used herein is to be given its broadest meaning. In terms of the conductive layer, it may be formed as a metal or metalized strip, or it may be, as illustrated in FIG. 3C, includes conductive deposits 110 randomly applied to the surface of one of the layers 104, 106 flanking the conductive material. The conductive layer may also be formed in a composite structure layer, such as where conductive material is embedded or otherwise dispersed within a dielectric/insulative body such as ferrous particles formed in a silicone body in CHO-MUTE 9020 RF Absorber material. Similarly, the conductive deposits 110 may be applied to one surface of a Kapton film and then covered with a dielectric coating. It has been found that although the ESD material referenced above provides good results, the polyester and polyethylene layers 104, 106 flanking the conductive material 102 deteriorate under high temperatures encountered in IR solder reflow processes. Accordingly, a dielectric material with high thermal resistivity is used, such as Kapton, manufactured by DuPont, or one of the CHO-MUTE Absorber materials manufactured by Chomerics, a division of Parker-Hannifin Corporation. These materials reliably resist the high temperatures encountered in solder reflow IR ovens and maintain their inherent flexibility.

Figure 3D:
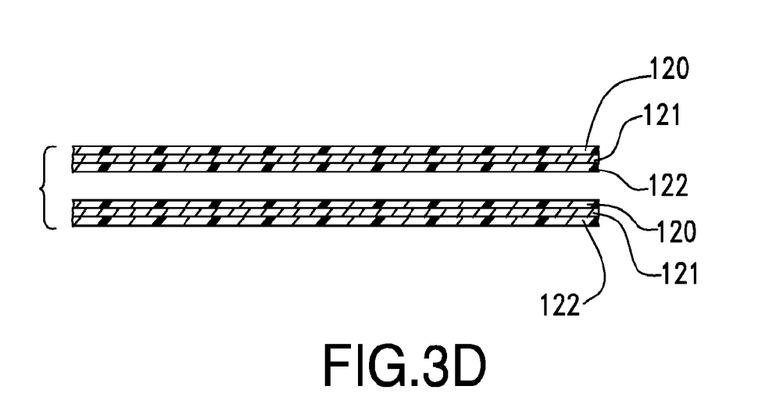
FIG. 3D is a sectional view of a shield member assembly, formed of multiple layered sheets.

The shield member preferably has a thickness sufficient to form the impressions and to fill the gap between the receptacle and the board. In this regard, shield members with thicknesses of between about 0.004 to about 0.015 and slightly greater are suitable. The shield member may be formed of the three layers described above, or it may be formed of multiple sheets with the layers integrated in each sheet. For example, sheet members may be made of a Kapton-conductive material-Kapton arrangement as best illustrated in FIG. 3D where two Kapton layers 120, 122 flank a conductive deposit layer 121 to form a sheet and multiple sheets, such as 4 to 5 sheets, may be arranged in a stack to form the resulting shield member. This multiple stacking completely fills the gap between the receptacle 50 and the circuit board 64 with a random conductive deposit arrangement. Alternatively, the sheet members maybe be formed with a Kapton layer as 120, a conductive deposit layer 12 and an overcoat layer 122 in place of the Kapton. In such an arrangement, it is desirable to have the sheets oriented in the same manner, with all of them having their overcoat layers facing up or facing down.

Figure 6:
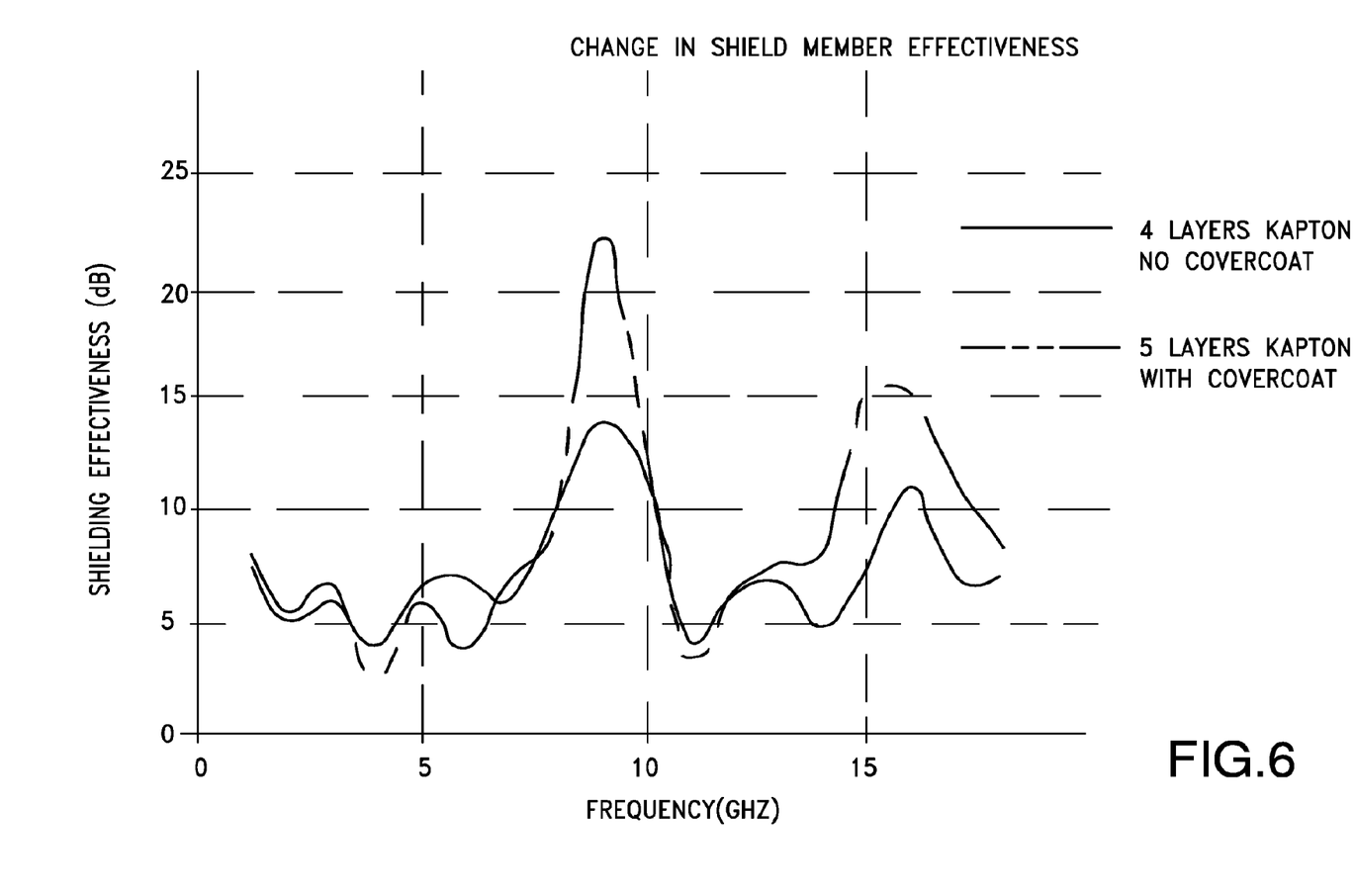
FIG. 6 is a graph illustrating the change in shield member effectiveness for shield members formed from 4 layers of Kapton and conductive deposits and from 5 layers of Kapton with conductive deposits and a covercoat.

Additionally, the thickness may be utilized so as to provide the shield member with attachment flaps 88 that are disposed around the perimeter of the shield member 80 (FIG. 2) and which are formed at an angle to the plane of the shield member. A pressure-sensitive adhesive may be applied to the inner surfaces 89 of these flaps 88 so that they adhere to the receptacle when pressed against it. Still further, the shield member 80 may have a plurality of holes 87 punched therein that are in registration with the compliant mounting pins 85 of the receptacle 50. These holes 87 may be smaller than the mounting pins 85 so that an interference fit exists between the shield member and receptacle mounting pins 85, such that the shield member 80 will readily stay in place on the receptacle. Or, the holes 87 may be larger than the associated diameters or widths of the mounting pins 85. It can be seen that the present disclosure provides a simple and cost-effective EMI solution to receptacles and cages. FIG. 6 is a graph showing the change in shielding effectiveness between two shield members according to the Present Disclosure. One such shield member as represented by the solid line is formed of 4 layers of Kapton, each with a deposit of conductive material thereon, and its effectiveness at about 10 GHz is about 14 dB, while the other such shield member as represented by the dot and dashed line is formed of 5 layers of a Kapton-conductive material-covercoat sheet and its effectiveness at about 10 GHz is about 22.5 dB. Increasing the number of sheets and use of a covercoat layer appears to increase the overall performance of the shield member. The covercoat layer commonly used by us is a cured polymide coating, similar to solder mask material, examples of which are Rogers R/flex and Nippon Polytech NPR-80.

While preferred embodiments have been shown and described, it is envisioned that those skilled in the art may devise various modifications without departing from the spirit and scope of the foregoing Description and the appended Claims.

What is claimed is:

1. A receptacle assembly, the receptacle assembly comprising:
a hollow cage, the cage including a front end and a plurality of walls, the front end including an opening, the opening communicating with a hollow interior portion thereof of the front end and receiving a module therein, the walls including at least two opposing sidewalls and opposing top and bottom walls, the bottom wall including a bottom opening disposed therein, the bottom opening sized to receive a connector, the connector being mounted to a circuit board, the bottom wall joined to the circuit board; and
flexible, layered EMI shield member disposed along the bottom wall, the shield member extending completely around the bottom wall opening and having a generally horizontal body portion, the body portion including a plurality of contact points extending out of the plane of the shield member, the shield member being held between the cage and the circuit board when the cage is mounted to the circuit board, the shield member forming a shielded interface between the cage and the circuit board and completely encompassing the bottom opening.

2. The receptacle assembly of claim 1, wherein the shield member is formed from an ESD bag material.

3. The receptacle assembly of claim 1, wherein the shield member is a multilayered material including at least one conductive layer sandwiched between two insulative layers.

4. The receptacle assembly of claim 3, wherein the insulative layers include a polyester layer and a polyethylene layer.

5. The receptacle assembly of claim 3, wherein the two insulative layers are Kapton sheets.

6. The receptacle assembly of claim 3, wherein the conductive layer includes a layer of sputtered or deposited aluminum, copper or an alloy thereof.

7. The receptacle assembly of claim 1, where the shield member is formed from a plurality of sheets, each sheet including at least a first insulative layer and a conductive material layer.

8. The receptacle assembly of claim 7, wherein the first insulative layer is a sheet of Kapton, and the conductive material layer includes conductive matter randomly arranged in opposition to the first insulative layer.

9. The receptacle assembly of claim 7, further including a second insulative layer, the conductive material layer being interposed between the first and second insulative layers.

10. The receptacle assembly of claim 9, wherein the first and second insulative layers are Kapton sheets, and the conductive material layer is deposited on a surface of one of the Kapton sheets.

11. The receptacle assembly of claim 7, further including a polyimide coating layer.

12. The receptacle assembly of claim 1, wherein the contact points include impressions formed in the shield member.

13. The receptacle assembly of claim 12, wherein the impressions are arranged in a pattern within the shield member body portion, the pattern being chosen from the group consisting of a dimple pattern, a waffle pattern, an accordion-shaped pattern and a wrinkled pattern.

14. The receptacle assembly of claim 1, wherein the shield member includes at least one attachment tab, each tab extending at an angle from the shield member body portion and including an adhesive portion, the adhesive portion attaching the shield member to the cage.

15. The receptacle assembly of claim 1, wherein the cage further includes a plurality of mounting pins, and the shield member further includes a plurality of holes aligned with the mounting pins, the holes being smaller than the mounting pins to provide an interference fit between the shield member and the cage when the mounting pins are inserted into holes.

16. A shield member for providing an EMI shielding interface between a module-receiving receptacle and a circuit board, the shield member, comprising a flexible multilayered body portion, the body portion extending generally in a single plane and including a sheet the sheet including at least one opening formed therein, at least a first dielectric layer and a conductive layer, the conductive layer containing conductive material deposited along a surface of the dielectric layer, each opening corresponding to an opening in the receptacle, the shield member including a plurality of contact points, the contact points projecting from opposite surfaces thereof.

17. The shield member of claim 16, wherein the sheet further includes a second dielectric layer disposed in opposition to the first dielectric layer, the conductive layer being disposed between the first and second dielectric layers.

18. The shield member of claim 17, wherein the shield member is formed from multiple sheets stacked upon each other.

19. The shield member of claim 16, wherein the sheet further includes a covercoat layer, the covercoat layer including a polyimide coating, the conductive layer being disposed between the first dielectric layer and the covercoat layer.

20. The shield member of claim 19, wherein the shield member is formed from multiple sheets stacked upon each other.

* * * * *